United States Patent
Wei et al.

(10) Patent No.: US 8,747,631 B2
(45) Date of Patent: Jun. 10, 2014

(54) APPARATUS AND METHOD UTILIZING A DOUBLE GLOW DISCHARGE PLASMA FOR SPUTTER CLEANING

(75) Inventors: Ronghua Wei, San Antonio, TX (US); Edward Langa, San Antonio, TX (US); Sabrina L. Lee, Schenectaday, NY (US)

(73) Assignee: Southwest Research Institute, San Antonio, TX (US)

( * ) Notice: Subject to any disclaimer, the term of this patent is extended or adjusted under 35 U.S.C. 154(b) by 872 days.

(21) Appl. No.: 12/723,816

(22) Filed: Mar. 15, 2010

(65) Prior Publication Data
US 2011/0220490 A1 Sep. 15, 2011

(51) Int. Cl.
| | |
|---|---|
| C23C 14/00 | (2006.01) |
| C23C 14/32 | (2006.01) |
| C25B 9/00 | (2006.01) |
| C25B 11/00 | (2006.01) |
| C25B 13/00 | (2006.01) |
| C23C 14/02 | (2006.01) |
| B44C 1/22 | (2006.01) |
| C03C 15/00 | (2006.01) |
| C03C 25/68 | (2006.01) |
| C23F 1/00 | (2006.01) |

(52) U.S. Cl.
USPC ............ 204/192.3; 204/192.1; 204/192.12; 204/298.21; 216/71; 427/534

(58) Field of Classification Search
USPC ............ 204/192.12, 192.32, 298.14, 298.21, 204/298.34; 216/71; 427/534
See application file for complete search history.

(56) References Cited

U.S. PATENT DOCUMENTS

| | | |
|---|---|---|
| 3,775,285 A | 11/1973 | Lane et al. |
| 4,080,281 A | 3/1978 | Endo |
| 4,126,530 A | 11/1978 | Thornton |
| 4,179,351 A | 12/1979 | Hawton et al. |
| 4,407,713 A | 10/1983 | Zega |
| 4,410,407 A | 10/1983 | Macaulay |
| 4,445,997 A | 5/1984 | McKelvey |
| 4,478,703 A | 10/1984 | Edamura et al. |
| 4,520,268 A | 5/1985 | Xu |
| 4,731,539 A | 3/1988 | Xu |
| 4,812,217 A | 3/1989 | George et al. |
| 5,268,085 A | 12/1993 | Nelson et al. |
| 5,427,666 A | 6/1995 | Mueller et al. |
| 5,464,518 A | 11/1995 | Sieck et al. |

(Continued)

FOREIGN PATENT DOCUMENTS

| | | | |
|---|---|---|---|
| GB | 2215739 A | * | 9/1989 |
| JP | 02251143 | | 8/1990 |
| JP | 4107268 | | 4/1992 |

OTHER PUBLICATIONS

Chiang, et al. "Oxidation studies of Cu—Cr-coated Cu—Nb microcomposite" Surface and Coatings Technology vol. 61, Issues 1-3, Dec. 3, 1993, pp. 20-24.

(Continued)

*Primary Examiner* — Michael Band
(74) *Attorney, Agent, or Firm* — Grossman, Tucker et al (57) ABSTRACT

The present disclosure relates to an apparatus and method utilizing double glow discharge for sputter cleaning of a selected surface. The surface may include the inner surface of a hollow substrate such as a tube which inner surface may then be coated via magnetron sputter deposition.

9 Claims, 10 Drawing Sheets

(56) References Cited

U.S. PATENT DOCUMENTS

| | | | |
|---|---|---|---|
| 5,516,403 | A | 5/1996 | Forster et al. |
| 5,527,438 | A | 6/1996 | Tepman |
| 5,557,927 | A | 9/1996 | Chiang et al. |
| 5,772,858 | A | 6/1998 | Tepman |
| 5,994,211 | A | 11/1999 | Wang et al. |
| 6,037,257 | A | 3/2000 | Chiang et al. |
| 6,042,700 | A | 3/2000 | Gopairaja et al. |
| 6,132,805 | A | 10/2000 | Moslehi |
| 6,190,511 | B1 | 2/2001 | Wei |
| 6,190,516 | B1 | 2/2001 | Xiong et al. |
| 6,204,550 | B1 | 3/2001 | Wang et al. |
| 6,299,831 | B1 | 10/2001 | Lo |
| 6,315,877 | B1 | 11/2001 | Goedicke et al. |
| 6,358,376 | B1 | 3/2002 | Wang et al. |
| 6,413,383 | B1 | 7/2002 | Chiang et al. |
| 6,498,091 | B1 | 12/2002 | Chen et al. |
| 6,663,755 | B2 | 12/2003 | Gorokhovsky |
| 6,709,553 | B2 | 3/2004 | Wang et al. |
| 6,719,883 | B2 | 4/2004 | Stimson |
| 6,730,196 | B2 | 5/2004 | Wang et al. |
| 6,740,393 | B1 | 5/2004 | Massler et al. |
| 6,758,949 | B2 | 7/2004 | Wang et al. |
| 6,767,436 | B2 | 7/2004 | Wei |
| 6,787,006 | B2 | 9/2004 | Gopalraja et al. |
| 6,863,699 | B1 | 3/2005 | Krasnov et al. |
| 7,320,331 | B1 | 1/2008 | Audino et al. |
| 7,578,908 | B2 | 8/2009 | Hockley et al. |
| 2002/0185370 | A1 | 12/2002 | Gopalraja et al. |
| 2003/0111337 | A1 | 6/2003 | Lin et al. |
| 2003/0209422 | A1 | 11/2003 | Wang et al. |
| 2004/0016635 | A1 | 1/2004 | Ford et al. |
| 2004/0020770 | A1 | 2/2004 | Wang et al. |
| 2004/0031680 | A1 | 2/2004 | Miller et al. |
| 2004/0045811 | A1 | 3/2004 | Wang et al. |
| 2004/0055870 | A1 | 3/2004 | Wei |
| 2005/0279630 | A1 | 12/2005 | Fonte |
| 2006/0076231 | A1 | 4/2006 | Wei |
| 2006/0076235 | A1 | 4/2006 | Wei |
| 2006/0137968 | A1 | 6/2006 | Hartig |
| 2006/0177581 | A1 | 8/2006 | Chiang et al. |
| 2006/0183305 | A1 | 8/2006 | Gao et al. |
| 2006/0251872 | A1 | 11/2006 | Wang et al. |
| 2006/0251917 | A1 | 11/2006 | Chiang et al. |
| 2007/0059502 | A1 | 3/2007 | Wang et al. |
| 2007/0087185 | A1* | 4/2007 | Wei et al. ................ 428/312.2 |
| 2008/0289957 | A1 | 11/2008 | Takigawa et al. |
| 2009/0114529 | A1 | 5/2009 | Dekempeneer et al. |
| 2010/0006421 | A1 | 1/2010 | Wei |

OTHER PUBLICATIONS

Chiang, et al. "Oxidation Kinetics of Cu-30vol.%Cr coating" Surface & coatings technology, 1996, vol. 78, No. 1-3, pp. 243-247 (17 ref.).

Chiang, et al. "Blanching resistant Cu—Cr coating by vacuum plasma spray" Surface & coatings technology,1995, vol. 76-77 (1), No. 1-3 (386 p.) (13 ref.) [Notes: Part. I], pp. 14-19.

Yee, et al. "Cylindrical Magnetron Sputtering in a Ferromagnetic Cylinder" Society of Vacuum Coaters 47th Annual Technical Conference Proceedings , pp. 421-425. 2004.

Ensinger "An Apparatus for Sputter Coating the Inner Walls of Tubes" Review of Scientific Instruments, vol. 67, Issue 1, Jan. 1996, pp. 318-321.

Rusch, "Tri-Service Green Gun Barrel (PP 1074)" Final Report, Mar. 31, 2003 (39 pages).

International Search Report dated Nov. 5, 2007 issued in related International Patent Application No. PCT/EP2007/052374.

Malik, et al., "Development of an energetic ion assisted mixing deposition process for TiNx and diamondlike carbon films, using a co-axial geometry in plasma source ion implantation," Journal of Vacuum Science & Technology A: Vacuum, Surfaces, and Films; Publication Date: Nov. 1997; vol. 15 Issue: 6; pp. 2875-2879.

Hosokawa et al., "Self-sputtering phenomena in high-rate coaxial cylindrical magnetron sputtering," J. Vac. Sci. Technol. vol. 14, Issue 1, pp. 143-146 (Jan. 1977).

Lee et al., "Electroplated and Plasma Enhanced Magnetron Sputtered Ta and Cr Coatings for High Temperature and High Pressure Operation," 2006 MRS Fall Meeting: Symposium DD—Materials Research at High Pressure, Jan. 1, 2006; Venue: Boston, Massachusetts, USA.

Xu et al., "Double glow plasma surface alloying and plasma nitriding," Surface and Coatings Technology vol. 201, Issues 9-11, Feb. 26, 2007, pp. 4822-4825.

Wei, et al., "Metal Plasma Immersion Ion Implantation and Deposition (MPIII&D) using a Newly Developed Plasma Source," Surface and Coatings Technology, vol. 200, Issues 1-4, Oct. 1, 2005, pp. 579-583.

Truszkowska et al., "Cylindrical Magnetron Sputter Deposition of Chromium Coatings for Erosion and Wear Resistant Application," Proceedings of the Annual Technical Conference- Society of Vacuum Coaters, 2004, Conf 47, pp. 282-288.

Wei, et al., "RF Plasma Enhanced Cylindrical Magnetron Sputter Deposition," 2008 Society of Vacuum Coaters, 51st Annual Technical Conference Proceedings, Chicago, IL, Apr. 19-24, 2008, pp. 559-564.

Xu et al., "Metal Ion Source for Metallic Surface Metallurgy," Proceedings: Tenth International Symposium on Discharges and Electric Insulation in Vacuum, pp. 368-373.

Li et al., "Diffusion Mechanism of Ion Bombardment," Surface Engineering 1987 vol. 4 No. 4 (3 pages).

Xu, et al., "Double glow plasma surface metallurgy and its applications," Plasma Surface Engineering Research and its Practical Applications, 2008: 355-379.

U.S. Office Action dated Mar. 14, 2011 issued in related U.S. Appl. No. 11/838,399.

U.S. Office Action dated Mar. 18, 2011 issued in related U.S. Appl. No. 11/749,739.

U.S. Office Action dated Aug. 13, 2010 issued in related U.S. Appl. No. 11/749,739.

U.S. Office Action dated Sep. 22, 2010 issued in related U.S. Appl. No. 11/838,399.

* cited by examiner

| Test No | Process | Time (min) | P (mT) | Q Ar (sccm) | Gun Tube -V GT (V) | Gun Tube I GT (A) | Shield Tube -V SH (V) | Shield Tube I SH (A) | DC Magnetron P MAG (kW) | DC Magnetron -V MAG (V) | HMP Magnetron P AVE (KVA) | HMP Magnetron -V PK (V) | Coating Thickness (μm) |
|---|---|---|---|---|---|---|---|---|---|---|---|---|---|
| 1 | Gun Tube Cleaning | 30 | 150 | 150 | 1100 | 3.07 | 200 | 1.9 | | | | | |
| 2 | Gun Tube Cleaning | 60 | 155 | 132 | 900 | 1.83 | 140 | 0.82 | | | | | |
| 3 | Gun Tube Cleaning | 17 | 150 | 133 | 600 | 3.75 | 200 | 1.89 | | | | | |
|   | Magnetron Cleaning | 10 | 4 | 19 | | | | | 0.35 | 114 | | | |
| 4 | Gun Tube Cleaning | 60 | 150 | 150 | 900 | 2.27 | 150 | 0.94 | | | | | |
|   | Magnetron Cleaning | 70 | 2.5 | 18.9 | 100 | 0.5 | | | 0.385 | 382 | | | |
| 5 | Gun Tube Cleaning | 45 | 150 | 150 | 750 | 3.26 | 140 | 1.86 | | | | | |
|   | Magnetron Cleaning | 20 | 2.4 | 30 | | | | | 0.55 | 579 | | | |
| 6 | Gun Tube Cleaning | 30 | 150 | 150 | 850 | 1.66 | 140 | 0.96 | | | | | |
|   | Magnetron Cleaning | 10 | 2.9 | 40.2 | | | | | | | 0.4 | 1000 | |
| 7 | Gun Tube Cleaning | 60 | 150 | 150 | 800 | 2.52 | 100 | 1 | | | | | |
|   | Magnetron Cleaning | 20 | 3.6 | 50 | 0 | | | | 0.5 | 421 | | | |
|   | Ta Deposition | 240 | 3.5 | 50 | | | | | 2.5 | 469 | | | 39.6 |
| 8 | Gun Tube Cleaning | 60 | 150 | 150 | 800 | 2.4 | 100 | 1.19 | | | | | |
|   | Magnetron Cleaning | 20 | 3.5 | 50 | 50 | 0.3 | | | 0.5 | 408 | | | |
|   | Ta Deposition | 240 | 3.5 | 50 | | | | | 2.5 | 463 | | | 37.2 |

*FIG. 4*

| Test No | Process | Time (min) | P (mT) | Q Ar (sccm) | Gun Tube -V GT (V) | Gun Tube I GT (A) | Shield Tube -V SH (V) | Shield Tube I SH (A) | DC Magnetron P MAG (kW) | DC Magnetron -V MAG (V) | HMP Magnetron P AVE (KVA) | HMP Magnetron -V PK (V) | Coating Thickness (μm) |
|---|---|---|---|---|---|---|---|---|---|---|---|---|---|
| 9 | Gun Tube Cleaning | 60 | 150 | 150 | 800 | 2.39 | 100 | 1.26 | | | | | |
|   | Magnetron Cleaning | 20 | 3.3 | 50 | 50 | | | | | | 0.3 | 650 | |
|   | Ta Deposition | 240 | 3.3 | 50 | | | | | | | 2.5 | 845 | 35.4 |
| 10 | Gun Tube Cleaning | 60 | 150 | 150 | 800 | 2.48 | 100 | 1.28 | | | | | |
|   | Magnetron Cleaning | 20 | 3.4 | 50 | 50 | | | | | | 0.3 | 650 | |
|   | Ta Deposition | 240 | 3.4 | 50 | 0 | | | | | | 2.5 | 950 | 27.6 |
| 11 | Gun Tube Cleaning | 60 | 150 | 150 | 800 | 2.45 | 100 | 0.81 | | | | | |
|   | Magnetron Cleaning | 20 | 3.4 | 50 | 50 | | | | 0.5 | 438 | | | |
|   | Ta Deposition | 480 | 3.5 | 50 | | | | | 2.5 | 516 | | | 70.2 |
| 12 | Gun Tube Cleaning | 60 | 150 | 150 | 800 | 1.25 | 100 | 0.48 | | | | | |
|   | Magnetron Cleaning | 20 | 3.9 | 50 | 50 | 0.1 | | | 0.5 | 470 | | | |
|   | Ta Deposition | 480 | 3.5 | 50 | 0 | | | | 2.5 | 492 | | | 64.4 |
| 13 | Gun Tube Cleaning | 60 | 150 | 150 | 800 | 1.69 | 100 | 0.56 | | | | | |
|   | Magnetron Cleaning | 20 | 3.4 | 50 | 50 | | | | | | 0.3 | 650 | |
|   | Ta Deposition | 480 | 3.3 | 50 | | | | | | | 2.5 | 895 | 79.6 |
| 14 | Gun Tube Cleaning | 60 | 150 | 150 | 800 | 1.43 | 100 | 0.48 | | | | | |
|   | Magnetron Cleaning | 20 | 3.5 | 50 | 50 | | | | | | 0.3 | 665 | |
|   | Ta Deposition | 480 | 3.3 | 50 | 0 | | | | | | 2.5 | 885 | 66.7 |

APPARATUS AND METHOD UTILIZING A DOUBLE GLOW DISCHARGE PLASMA FOR SPUTTER CLEANING

GOVERNMENT RIGHTS CLAUSE

This invention was made with United States Government support under Contract No. W15QKN080498 awarded by the United States Army. The Government has certain rights in this invention."

FIELD OF THE INVENTION

The present disclosure relates to an apparatus and method utilizing double glow discharge for sputter cleaning of a selected surface. The surface may include the inner surface of a hollow substrate such as a tube which inner surface may then be coated via magnetron sputter deposition.

BACKGROUND

To prevent the inner surface of tubes/pipes from corrosion, oxidation, erosion or wear, a functional coating is typically applied. The coating may be a layer of metallic or ceramic coating. For instance, to increase the erosion/corrosion resistance of gun barrels for tanks, Cr and Ta coatings (100-200 µm) may be deposited.

In order to increase the coating adhesion to a substrate, and hence the coating lifetime, it is useful to clean its surface before the deposition of a coating. One may consider chemical cleaning or plasma cleaning. Chemical cleaning is to remove the dirt, rust or oil/grease from the surface, and it may be performed before the substrate enters the vacuum deposition system. Plasma cleaning is typically designed to remove the surface oxide ("native oxide") which exists on nearly all metal surfaces when they are exposed to air and other contaminants that cannot be easily removed using chemical cleaning.

Plasma cleaning is usually performed inside the vacuum system. After the plasma cleaning, deposition of the coating begins as soon as possible to minimize the surface re-oxidation. All the effort in developing cleaning procedures including the chemical and plasma cleaning and a suitable transition to deposition is to ensure the coating adhesion; therefore the coating functionality can be maintained. This invention discloses a plasma cleaning method by which tubes/pipes can be cleaned and therefore the coating adhesion is ensured. In the following, we use the example for cleaning tank gun barrels and magnetron sputter deposition of tantalum to describe the invention. However, the principle can be applied for coating other tubes/pipes.

SUMMARY

In a first exemplary embodiment, the present disclosure is directed to a method for coating of substrates within an evacuable chamber comprising a target and a substrate to be coated where the surface of the substrate is configured to be sputtered coated including an electrically conductive shield between the target and the substrate. This may then be followed by application of a relatively high negative voltage to the substrate and a relatively low negative voltage to the shield which provides a plasma between said substrate and shield and cleaning of the surface of said substrate.

In a second exemplary embodiment, the present disclosure is directed to a method for coating of substrates within an evacuable chamber comprising a sputter coating deposition apparatus including a target surface and a hollow substrate containing an inner surface to be sputter coated including an electrically conductive hollow shield tube surrounding the sputter coating deposition apparatus and positioned between the sputter coating deposition apparatus and the hollow substrate inner surface. This may then be followed by applying a relatively high negative voltage of −600V to −1500V to the substrate and a relatively low negative voltage of −100V to −200V to the shield and forming a plasma therebetween and cleaning the inner surface of the substrate.

In a third exemplary embodiment, the present disclosure relates to an apparatus for cleaning and coating of substrates comprising an evacuable chamber including a sputter coating deposition apparatus including a target surface and a hollow substrate containing an inner surface to be sputter coated including an electrically conductive hollow shield tube surrounding the sputter coating deposition apparatus and positioned between the sputter coating deposition apparatus and the hollow substrate inner surface. A power supply is included that supplys a relatively high negative voltage of −600V to −1500V to the substrate and a relatively low negative voltage of −100V to −200V to the shield for the formation of a plasma therebetween which serves to clean the inner surface of the hollow substrate.

BRIEF DESCRIPTION OF THE DRAWINGS

The above-mentioned and other features of this disclosure, and the manner of attaining them, will become more apparent and better understood by reference to the following description of embodiments described herein taken in conjunction with the accompanying drawings, wherein.

DETAILED DESCRIPTION

The present disclosure is directed at the use of double-glow discharge for the purpose of cleaning a selected portion of a substrate surface, which may then be followed by application of a sputter deposited coating, such as through the use of cylindrical magnetron sputter deposition.

Figure 1:
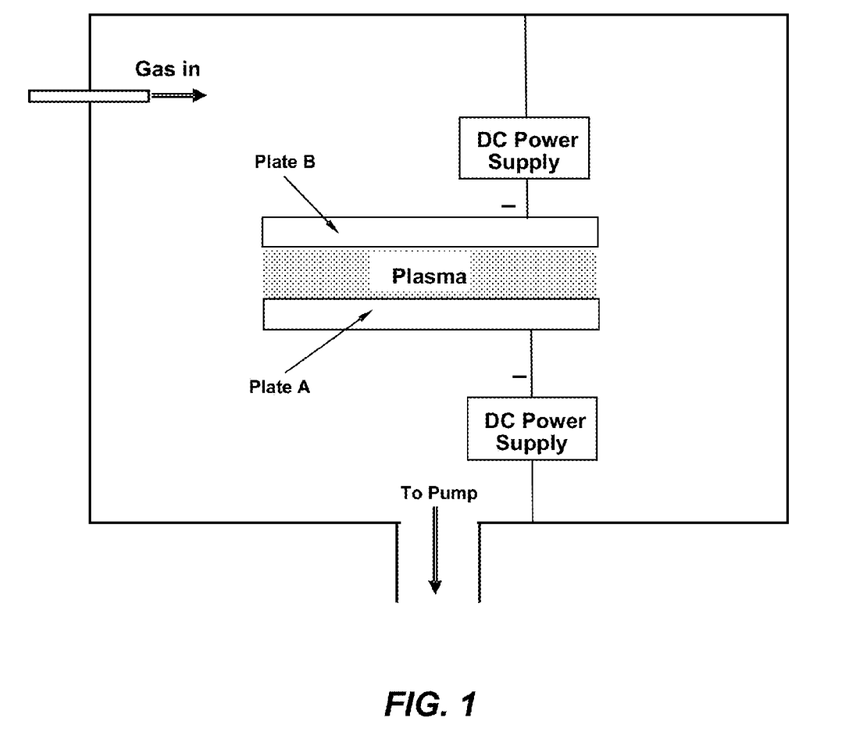
FIG. 1 illustrates a device for providing double glow discharge.

With attention directed to FIG. 1, when two parallel plates are placed in a vacuum chamber, which has been evacuated (e.g. to $1\times10^{-5}$ ton) followed by introduction of an inert gas (e.g. Ar, Kr and/or Xe) to a pressure of 150 millitorr, and if the two plates are biased with negative voltage as illustrated, a plasma may be formed. This may therefore be understood herein as a double glow discharge. It should also be noted that such plasma is relatively intense and relatively high current can be obtained from both power supplies. Furthermore, reference to plasma may be understood herein a gas in which a certain portion of the particles are ionized.

In the context of the present disclosure, the double glow discharge may now be more specifically used for cleaning a substrate surface (see below) when the voltage on one plate may be a negative DC voltage of −600V to −1500V including all values therein in 1.0 V increments. The voltage on the other plate may also be a negative DC voltage of −100 V to −200V including all values therein in 1.0 V increments.

As also illustrated, it is preferable herein to utilize two independently controlled power supplies and if a relatively low voltage is applied to Plate A, and a relatively high voltage is applied to Plate B, sputtering will now take place to Plate B and the sputtered material will be deposited on Plate A. In this manner, sputter cleaning of Plate B may take place, thereby providing the opportunity to remove oxides and other surface components that may interfere with an ensuing coating process. The removal of surface oxides may now take place such that for a given surface, the oxygen concentration identified by Auger Electron Spectroscopy (AES) may be less than 10.0 atomic percent (at. %), more preferably, less than 5.0 at. %, or in the range of 0.1-5.0 at. %. It may therefore be appreciated that as metals are typically oxidized under ambient conditions and metal oxides may interfere with an ensuing coating process, the removal of metal oxides may therefore improve an ensuing coating operation.

Figure 2:
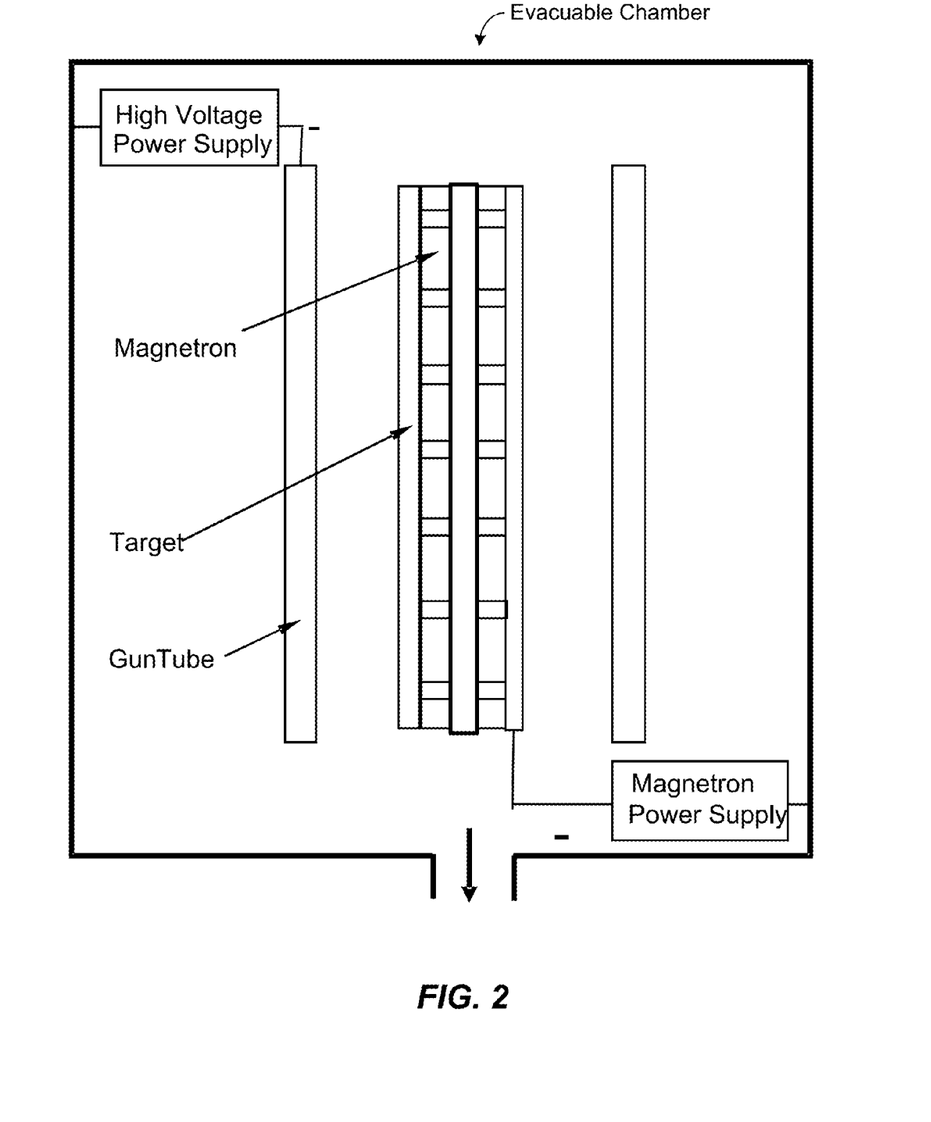
FIG. 2 illustrates a cylindrical magnetron sputter deposition apparatus without the use of a shield tube.

Shown in FIG. 2 is a cylindrical magnetron sputter deposition apparatus for coating of the inside surface of a hollow substrate, such as a tube, positioned within an evacuable chamber (a chamber that may provide a desired vacuum). As can be seen, located on the outside is the tube, in which a cylindrical magnetron may be inserted. In this case, it has been found to be relatively difficult to clean the inside of the tube using a double glow discharge method. First, if the magnetron is grounded, it is relatively difficult to generate glow discharge inside the gun barrel. Second if the magnetron is biased negatively with a separate power supply from the gun barrel, cross-contamination may occur.

Figure 3:
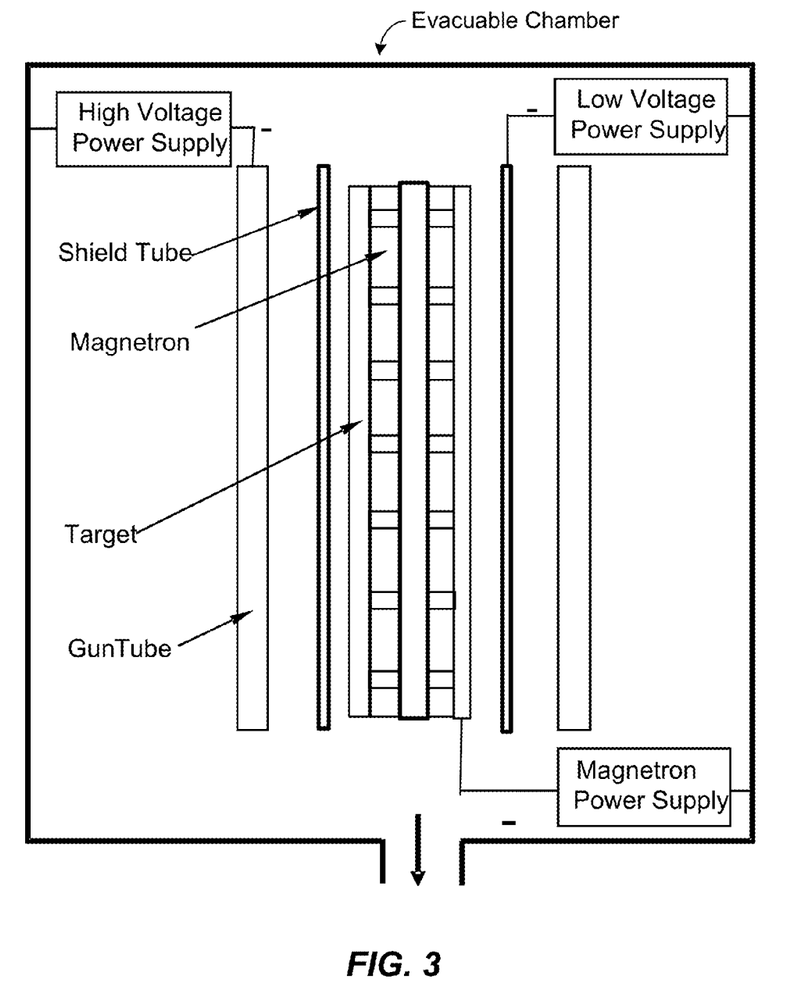
FIG. 3 illustrates a cylindrical magnetron sputter deposition apparatus that includes a shield tube.

Attention is next directed to FIG. 3. As can be seen, a shield tube is now inserted between a magnetron sputter deposition apparatus and the inside surface of the tube. Accordingly, it may be appreciated that the shield tube herein may be configured to contain any type of sputter deposition apparatus wherein a material is ejected from a target and deposits on a substrate. With the application of a negative voltage on the tube and a negative voltage on the shield tube, a double glow discharge can be readily generated between the shield and the tube. By applying a relatively high negative voltage to the tube (e.g. −600V to −1500V) and a relatively low negative voltage to the shield (e.g. −100 V to −200V) sputter cleaning of the inside surface of the tube can be achieved. Reference to a relatively high negative voltage to the substrate and relatively low negative voltage to the electrically conductive shield may therefore be understood as that situation where the substrate is at a higher negative voltage than the negative voltage of the shield. The sputtered materials from the inside surface of the tube (e.g. unwanted oxide and surface contaminants) may then be deposited on the outer surface of the shield tube and not on the magnetron.

Subsequent to cleaning of the inside surface of the tube, it may be appreciated that the shield tube may be grounded and the magnetron may be turned on to a relatively low level (e.g.

less than or equal to about 500 W. In such manner the target surface on the magnetron may now be cleaned, while the sputtered target materials (again, unwanted oxide and surface contaminants) may be deposited on the inner surface of the shield tube. After cleaning of both the inside surface of the substrate tube and the magnetron target surface, the shield tube can be removed. Then the deposition of a desired coating may be initiated. In such manner, the inside surface of a hollow substrate and a target surface of a magnetron may be cleaned to provide an overall improvement in sputter coating efficiency.

EXAMPLES

Figure 4:
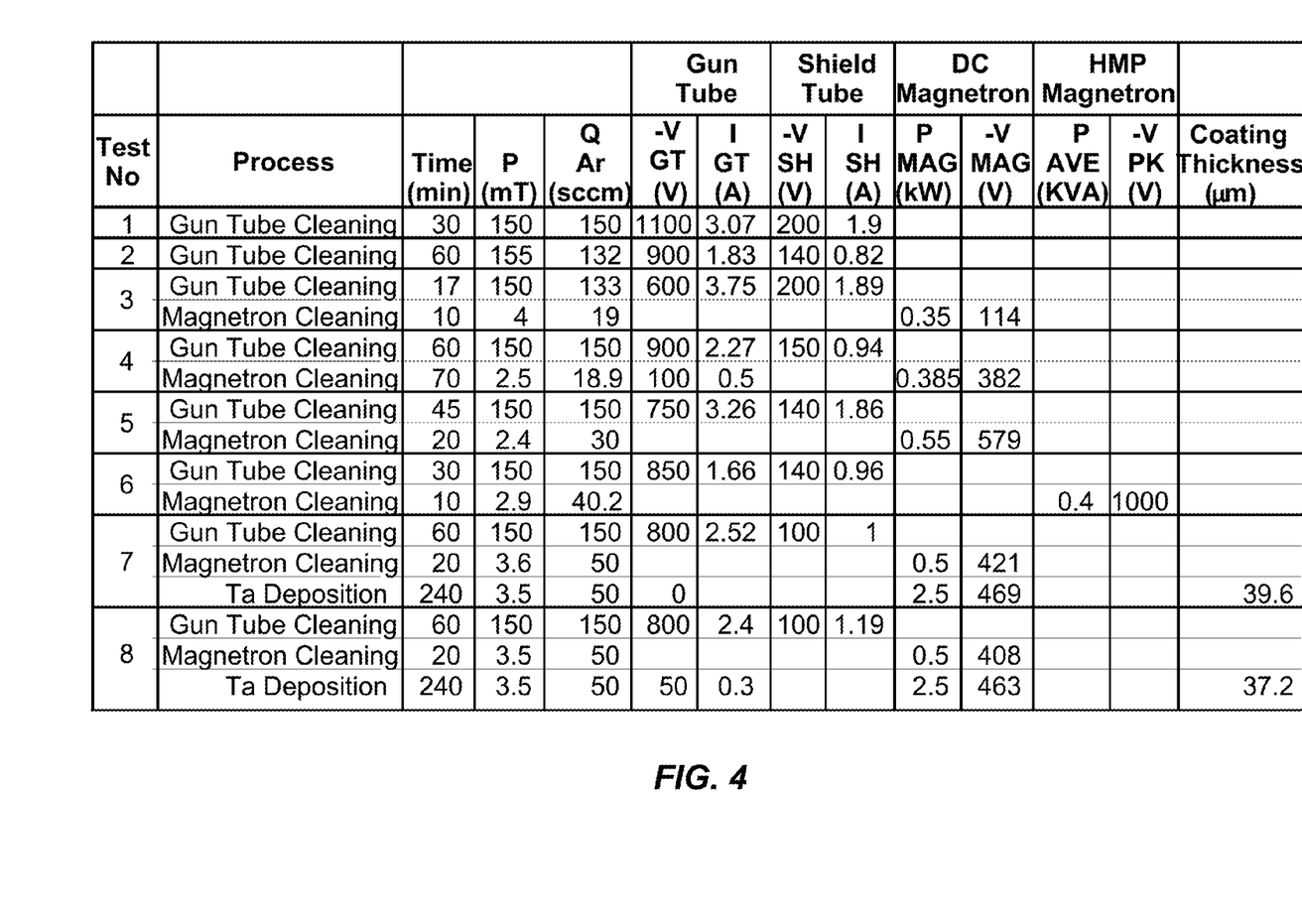
FIGS. 4-5 provide the results of test nos. 1-14 illustrating the general cleaning conditions for double glow discharge cleaning of the inside surface of the hollow substrate (gun tube) and the processing parameters for the magnetron deposition.
Figure 5:
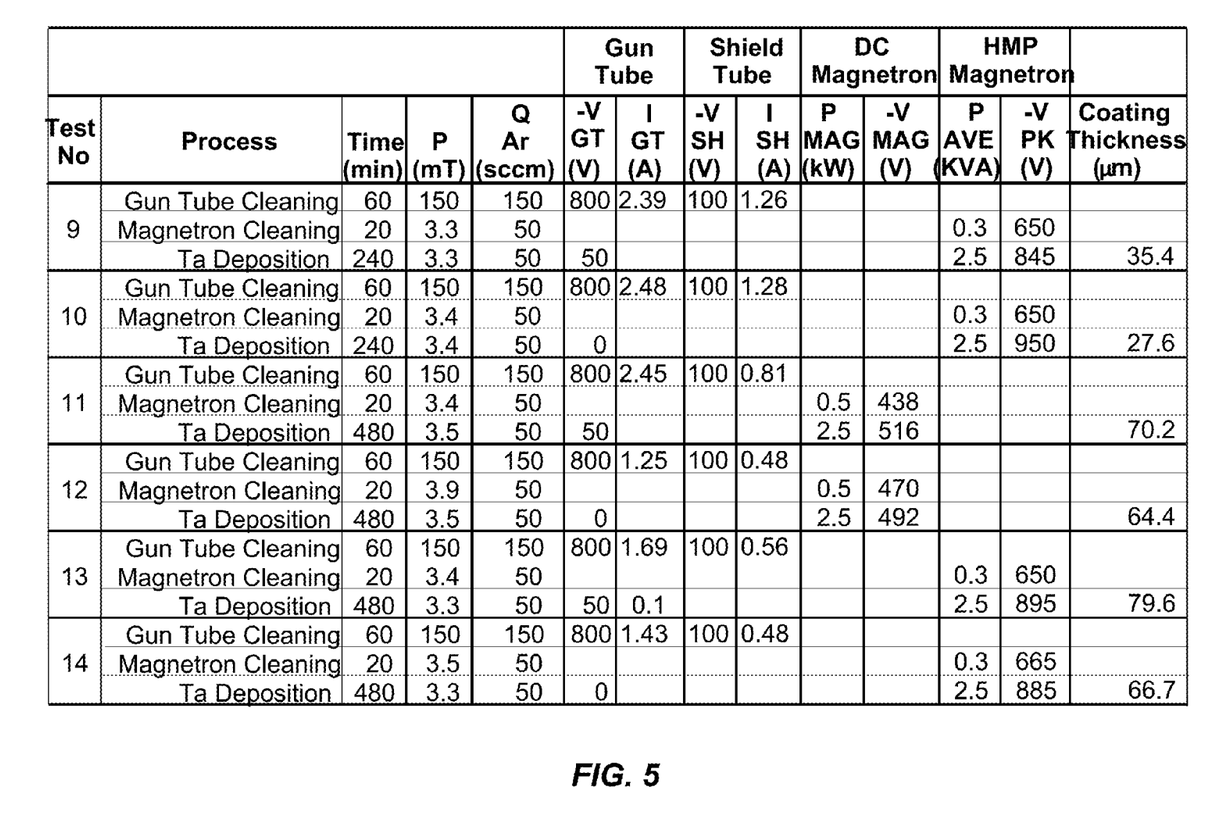

Attention is directed to FIGS. 4-5 which includes a table with indicated testing parameters. The first column identifies the test number. The second column describes the process including the step of gun tube cleaning, target sputter cleaning and Ta deposition on the inside surface of the tube. Listed from column 3 to column 9 are the general processing parameters for each identified process including the processing time T in column 3, chamber pressure P in millitorr (mT) in column 4, Ar flow rate Q in standard cubic centimeter per minute (sccm) in column 5, voltage applied to the gun tube V in column 6, current I in amps (A) obtained at the gun tube in column 7, voltage V used on the shield tube in column 8, and current I obtained on the shield tube in column 9. The processing parameters for the magnetron deposition are listed from column 10 to column 13. Two types of power supplies were employed. One was a DC power supply and the other was a high voltage pulsed DC power supply made by Huetinger (Model # HMP 1/1). Listed in columns 10 and 11 are the power and the voltage for the DC magnetron when it was used, while listed in columns 12 and 13 are the average power and the peak DC voltage used for the HMP power supply when it was used. Listed in the last column of the table is the coating thickness.

From the above, it may be appreciated that the time for cleaning of the inside surface of a hollow substrate is contemplated to be in the range of 15 minutes to 75 min, and preferably, in the range of 30 minutes to 60 minutes. The chamber pressure during cleaning may be in the range of 100 to 200 mT, preferably 125 to 175 millitorr, most preferably 150 millitorr. The inert gas flow during cleaning may be in the range of 100 to 200 sccm, preferably 125 to 175 sccm, more preferably 150 sccm. The voltage on the hollow substrate may be as noted in the range of 600 V to 1500 V. The current on the hollow substrate may be in the range of 1.0 to 4.0 amps. The voltage on the shield tube may be as noted in the range of 100 V to 200 V.

As can be seen, in test nos. 1 and 2, testing was only made to confirm that one could clean a hollow substrate such as a gun tube formed from gun steel, which were first oxidized in a furnace at 350° C. for 3 hours. Such oxide is considered to be relatively thicker than the oxides that may typically be present due to exposure of a metal to ambient conditions. As noted below, Auger Electron Spectroscopy (AES) may be utilized to identify the presence of absence of an oxide layer. It should also be noted that in test nos. 3-5, after cleaning of the gun tube the magnetron target was cleaned using the DC magnetron power supply. In test no. 6, after the cleaning of the gun tube, the magnetron target was cleaned using the HMP power supply. In test nos. 7-14, after the cleaning of both the gun tube and the magnetron, a Ta coating was deposited using either the DC power supply or the HMP power supply.

Figure 6:
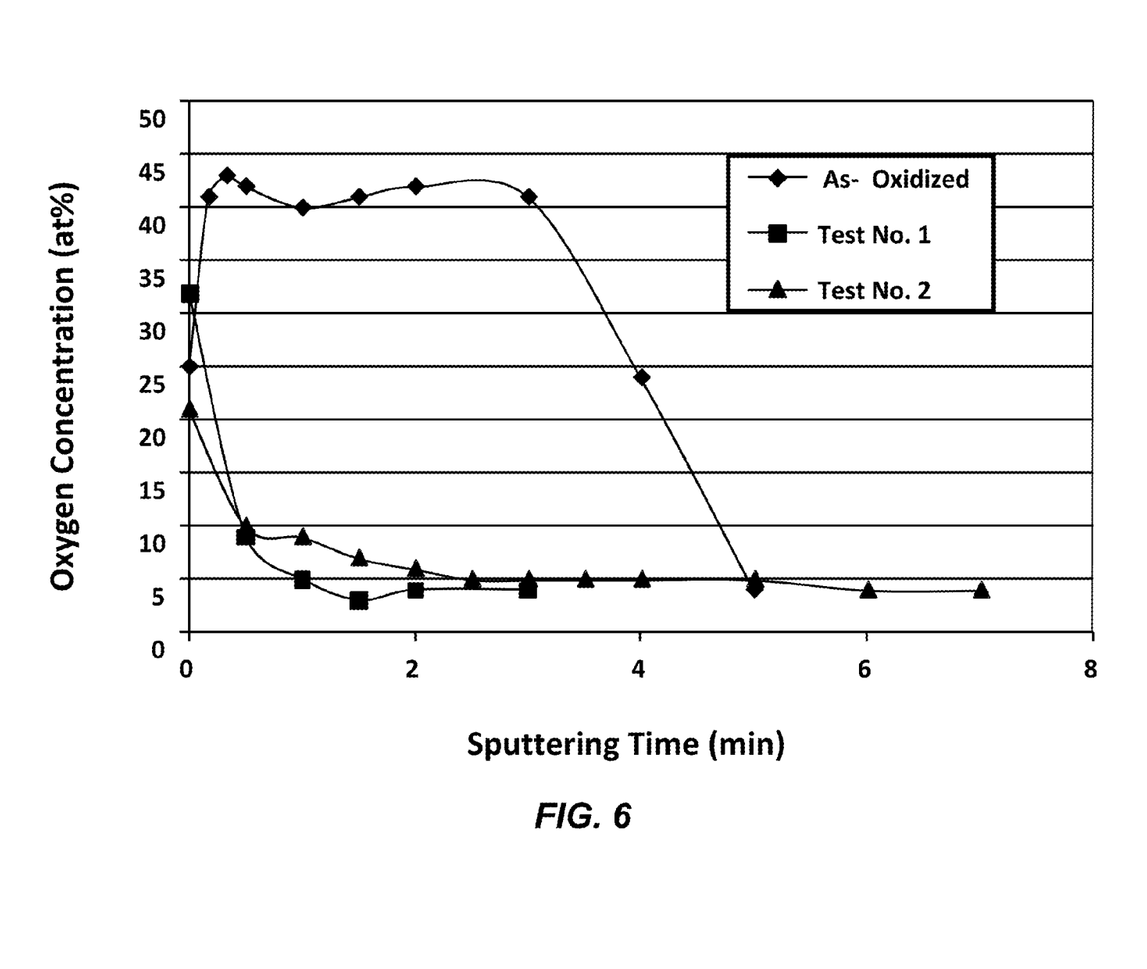
FIG. 6 provides the results of Auger Electron Spectroscopy (AES) analysis for the "as oxidized" surfaces of a hollow substrate prior to cleaning and the results for surfaces cleaned in tests nos. 1 and 2 in FIG. 4.
Figure 7A:
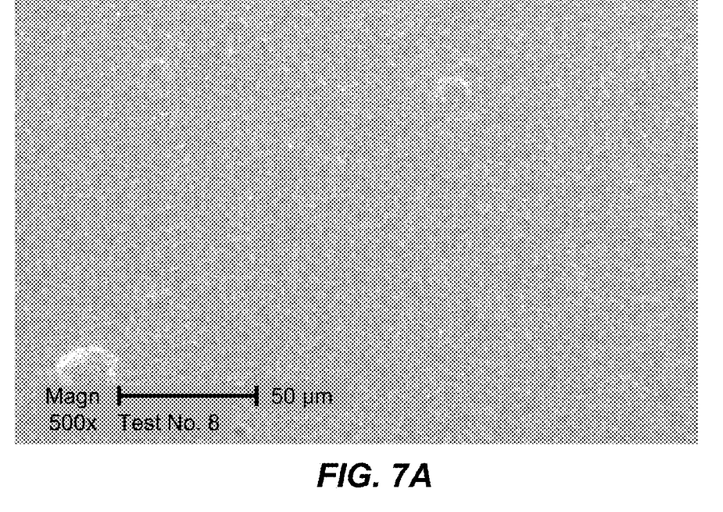
FIGS. 7A, 7B, 7C and 7D are scanning electron microscopy images of test nos. 8 and 10 for a Ta coating applied to a substrate surface which has undergone the indicated double glow discharge cleaning.
Figure 7B:
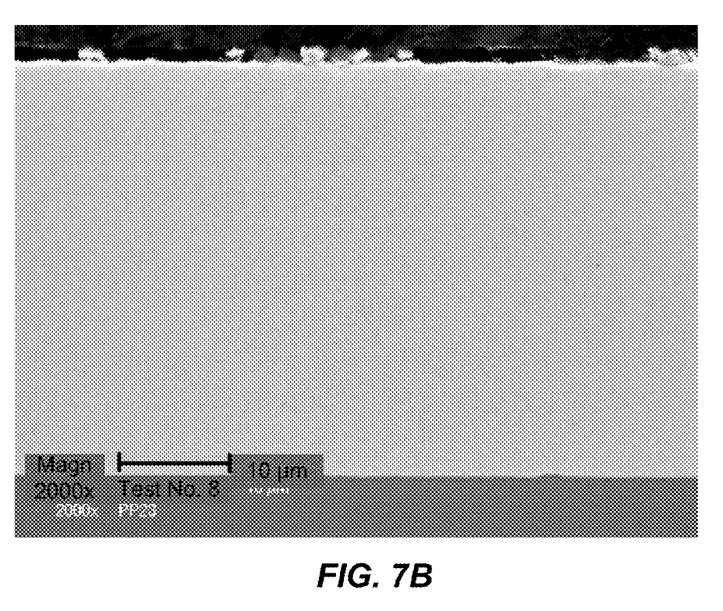
Figure 7C:
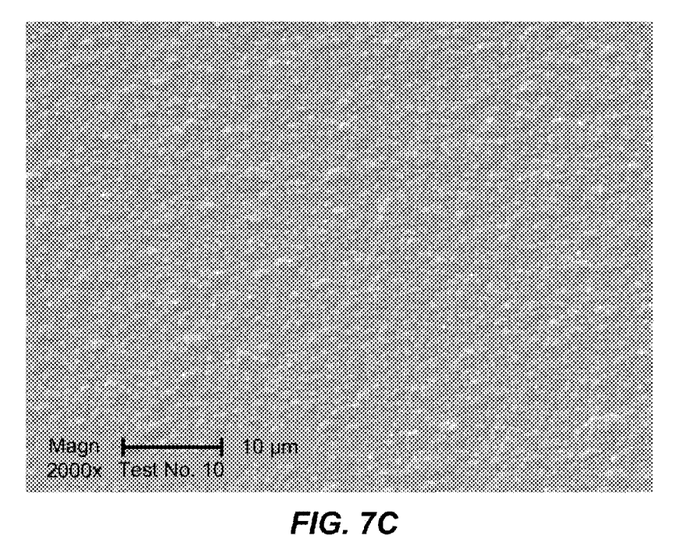
Figure 7D:
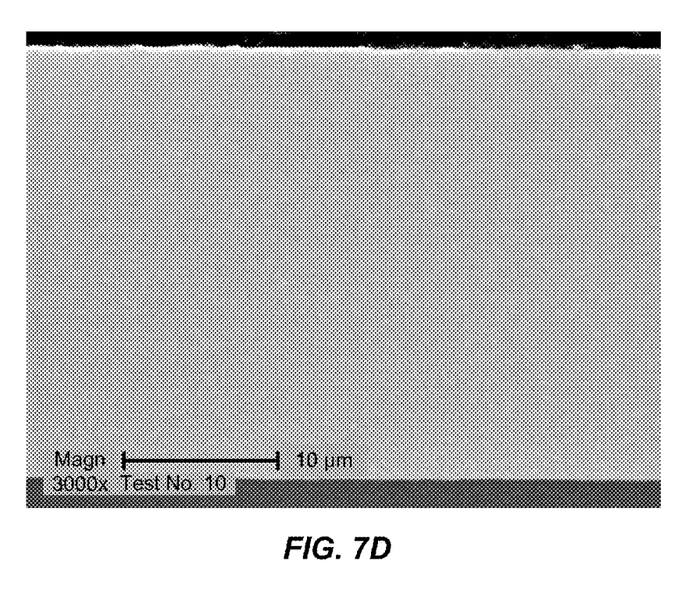
Figure 8A:
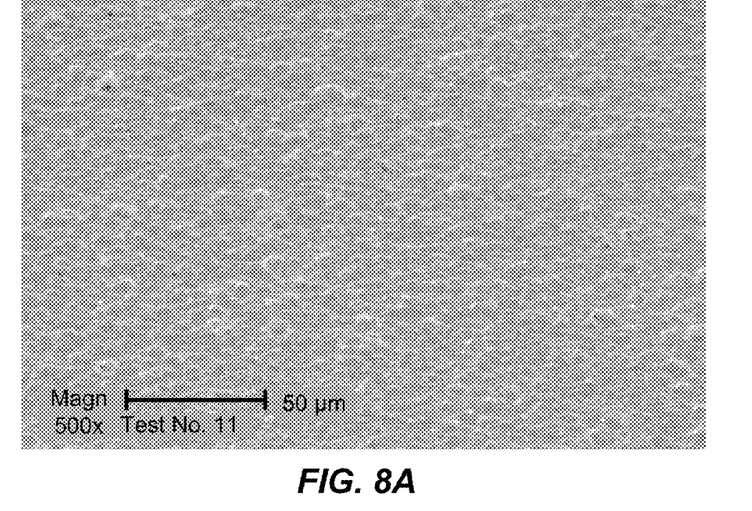
FIGS. 8A, 8B, 8C and 8D are scanning electron microscopy images of test nos. 11 and 14 for a Ta coating applied to a substrate surface which has undergone the indicated double glow discharge cleaning.
Figure 8B:
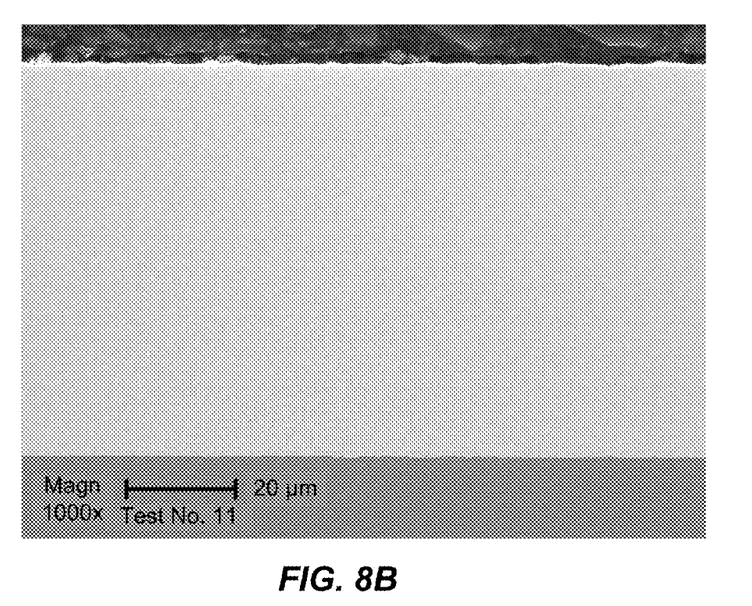
Figure 8C:
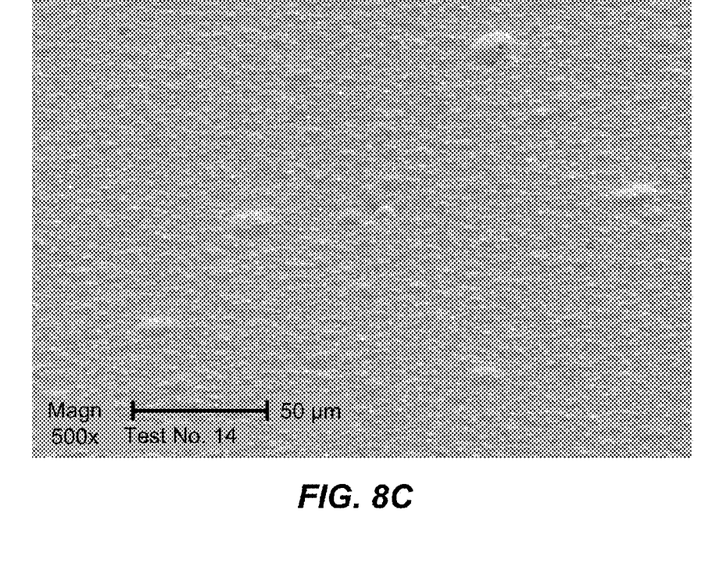
Figure 8D:
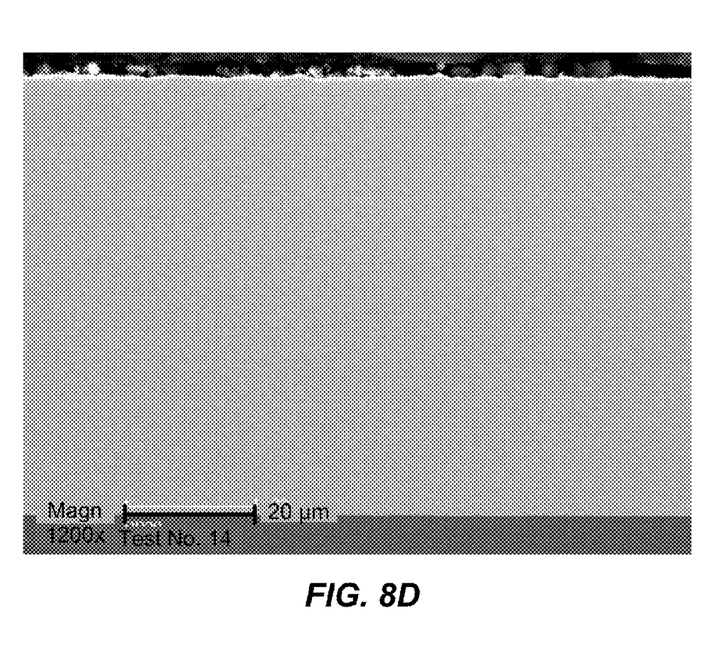

It is noted the sputtering rate for the Auger Electron Spectroscopy (AES) analysis utilized herein was about 30 nm/min. See FIG. 6. It may also be noted that the AES oxygen concentration may vary +/−5.0-10.0 at. %. For the as-oxidized samples (i.e. those samples oxidized at 350° C. for 3 hours) the oxygen concentration was initially at about 40 at. % and the thickness of the oxide layer was about 150 nm. As can be seen, after double glow discharge plasma cleaning disclosed herein, for 30 minutes with −1100V on the gun tube (test no. 1) or 60 minutes with −900V on the gun tube (test no 2), the oxygen concentration provided a baseline value of 0.1-5.0 at. %, indicating that the relatively thick thermal oxide has been completely removed. This therefore confirms that native oxides, or oxide coatings that may be otherwise formed on metal surfaces under ambient conditions, may be readily cleaned and removed. It is also noted that this baseline oxide layer on the surface for both test no. 1 and test no. 2 is believed due to the re-oxidation formed during the transition of the samples from the processing chamber to the AES system. Therefore, the double glow discharge cleaning disclosed herein has been confirmed to be relatively effective.

After these two tests, a few more tests (test nos. 3-6) were conducted using the gun tube bias from 600V-900V with the shield tube being at 140V to 200V, and eventually the bias voltage on the gun tube was set at 800V while the bias voltage on the shield tube at 100V. The relatively high voltage on the gun tube was to promote the result that the surface of the gun tube is sputter cleaned, not the shield tube. However, it may be appreciated that too high a relative bias voltage on the gun tube may cause arcing, while too low a bias on the shield tube would not start the double glow discharge. As noted above, the preferred sputter cleaning time was identified at 60 minutes. For the Ta deposition study started from test no. 7, the thermally oxidized samples are not used anymore.

To clean the surface oxide from the target, as noted above one may apply a relatively low power to the magnetron. In the experimental data provided in FIGS. 4-5, 0.3-0.5 kW was selected for either the DC magnetron operation or the pulsed DC magnetron operation. The cleaning was considered adequate at 20 minutes, and it is contemplated that such cleaning may take place over a period of 10 minutes to 30 minutes.

Using the procedures for cleaning the gun tube and the target described above, eight deposition tests were conducted (test nos. 7-14) using two deposition methods: DC magnetron sputtering and relatively high voltage pulsed DC sputtering using the Huetinger HMP power supply, which is commonly called High Power Impulse Magnetron Sputtering (HIPIMS). In test nos. 7-10, a relatively shorter deposition of 240 minutes was performed, while in test nos. 11-29, the deposition time was doubled. When a DC magnetron sputtering mode was used, the magnetron power was set at 2.5 kW. If the magnetron power is too high it may cause arcing. If the magnetron power is too low it results in a low deposition rate, or a long deposition time for a required coating thickness. When the HMP power supply was used, the average power was set at about 2.5 KVA and the pulsed voltage was set at 850-900V.

In magnetron sputter deposition, the part being deposited is commonly biased at a low negative voltage to attract ions. Ion bombardment increases the film density and adhesion. In tests 7-14, a DC power supply was used to bias the gun tube at 50 V in one half of the tests, while for the other half, no bias was used. When the gun tube was biased, a small current was measured (0.3 A in test no. 8 and 0.1 A in test no. 13).

After the deposition, samples were examined using scanning electron microscopy (SEM) for the coating morphology and cross-sectional microstructure. Shown in FIGS. 7A, 7B, 7C and 7D are selected SEM images of Ta coatings on the indicated gun steel test samples deposited for 240 minutes, while FIGS. 8A, 8B, 8C and 8D shows the selected SEM images of Ta coatings on the indicated gun steel test samples deposited for 480 minutes. These coatings all confirm the presence of a relatively high quality continuous dense structure without any signs of delamination from the underlying substrate surface at the indicated magnifications. Based on the cross-sectional SEM image, the coating thickness can be measured and it is listed in last column of FIGS. 5-6. A deposition rate of 8-10 μm/h was obtained, which is considered to be relatively efficient.

The foregoing description of several methods and embodiments has been presented for the purpose of illustration. It is not intended to be exhaustive or limit the claims to the precise steps and/or forms disclosed and modifications may be possible in light of the above teachings. It is intended therefore that the scope of the claims be understood with respect to the claims appended hereto.

What is claimed is:

1. A method for coating of substrates within an evacuable chamber comprising:
    providing a cylindrical target surface on a magnetron, a hollow substrate to be coated where an inside surface of the substrate includes surface oxides, and an electrically conductive shield tube between the cylindrical target surface and said hollow substrate;
    applying a relatively high negative voltage to said hollow substrate and a relatively low negative voltage to said shield tube, evacuating the evacuable chamber to a specified pressure, introducing a gas flow of inert gas at a specified flow, and cleaning said inside surface of said hollow substrate, wherein said surface oxides are sputtered from said inside surface of said hollow substrate and deposited on an outer surface of said shield tube and not on said magnetron;
    grounding said shield tube and turning on said magnetron, cleaning said cylindrical target surface, removing surface oxides from said cylindrical target surface and depositing said surface oxides from said cylindrical target surface onto an inner surface of said shield tube; and
    removing said shield tube and sputtering a coating from the cylindrical target surface onto said inside surface of the hollow substrate.

2. The method of claim 1 wherein said cleaning of said inside surface of said hollow substrate provides an oxygen concentration determined by auger electron spectroscopy to be 0.1-5.0 at. %.

3. The method of claim 1 wherein said hollow substrate's relatively high negative voltage is from −600V to −1500V and said shield tube's relatively low voltage is from −100V to −200V.

4. The method of claim 1 wherein said cleaning of said hollow substrate is for 15 minutes to 75 minutes.

5. The method of claim 1 wherein said evacuable chamber is brought to the specified pressure of 100 millitorr to 200 millitorr followed by introduction of a gas flow of inert gas at a specified flow of 100 sccm to 200 sccm.

6. A method for coating of substrates within an evacuable chamber comprising:
    providing a sputter coating deposition apparatus including a cylindrical target surface on a magnetron, a hollow substrate containing an inner surface to be sputter coated including surface oxides, and an electrically conductive hollow shield tube surrounding said sputter coating deposition apparatus and positioned between said sputter coating deposition apparatus and said hollow substrate inner surface;

applying a relatively high negative voltage of −600V to −1500V to said hollow substrate and a relatively low negative voltage of −100V to −200V to said hollow shield tube and forming a plasma therebetween, evacuating the evacuable chamber to a specified pressure, introducing a gas flow of inert gas at a specified flow, and cleaning said inner surface of said hollow substrate, wherein said surface oxides are sputtered from said inner surface of said hollow substrate and deposited on an outer surface of said hollow shield tube and not on said magnetron grounding said hollow shield tube and turning on said magnetron to less than or equal to 500 W, cleaning said cylindrical target surface, removing surface oxides from said cylindrical target surface and depositing said surface oxides from said cylindrical target surface on the inner surface of said hollow shield tube; and removing said shield tube and sputtering a coating from the cylindrical target surface onto said inside surface of the hollow substrate.

7. The method of claim 6 wherein said cleaning of said inner surface of said hollow substrate provides an oxygen concentration determined by auger electron spectroscopy to be 0.1-5.0 at. %.

8. The method of claim 6 wherein said cleaning of said hollow substrate inner surface is for 15 minutes to 75 minutes.

9. The method of claim 6 wherein said evacuable chamber provides a specified pressure of 100 millitorr to 200 millitorr followed by introduction of a gas flow of inert gas at a specified flow of 100 sccm to 200 sccm prior to cleaning.

* * * * *